(12) United States Patent
Heeren

(10) Patent No.: US 8,947,477 B2
(45) Date of Patent: *Feb. 3, 2015

(54) APPARATUS AND METHOD FOR MOUNTING PARTICLES ON A CARRIER

(71) Applicant: Océ-Technologies B.V., Venlo (NL)

(72) Inventor: Theodorus A. G. Heeren, Venlo (NL)

(73) Assignee: Oce-Technologies B.V., Venlo (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/293,914

(22) Filed: Jun. 2, 2014

(65) Prior Publication Data

US 2014/0272173 A1 Sep. 18, 2014

Related U.S. Application Data

(63) Continuation of application No. 13/443,382, filed on Apr. 10, 2012, now Pat. No. 8,767,026, which is a continuation of application No. PCT/EP2010/065708, filed on Oct. 19, 2010.

(30) Foreign Application Priority Data

| Oct. 20, 2009 | (EP) | 09173536 |
| Sep. 20, 2010 | (EP) | 10177546 |

(51) Int. Cl.
*B41J 2/41* (2006.01)
*B41M 1/42* (2006.01)
*H05K 3/10* (2006.01)
*G03G 15/22* (2006.01)
*G03G 15/34* (2006.01)
(Continued)

(52) U.S. Cl.
CPC .............. *H05K 3/102* (2013.01); *G03G 15/221* (2013.01); *G03G 15/348* (2013.01); *B41J 2/41* (2013.01); *B41J 2/415* (2013.01); *B41J 2/4155* (2013.01); *B41M 1/125* (2013.01); *B41M 1/42* (2013.01); *G03G 15/34* (2013.01); *G03G 15/346* (2013.01)
USPC .......................................... 347/112; 101/489

(58) Field of Classification Search
CPC .............. B41J 2/385; B41J 2/39; B41J 2/395; B41J 2/40; B41J 2/405; B41J 2/41; B41J 2/4155; B29C 41/006
USPC .......................................... 347/112; 101/489
See application file for complete search history.

(56) References Cited

U.S. PATENT DOCUMENTS

| 4,448,867 A | 5/1984 | Ohkubo et al. |
| 5,036,341 A | 7/1991 | Larsson |
| 5,934,545 A | 8/1999 | Gordon |

(Continued)

OTHER PUBLICATIONS

International Search Report for PCT/EP2010/065708 dated Jan. 26, 2011.

(Continued)

*Primary Examiner* — Judy Nguyen
*Assistant Examiner* — John M Royston
(74) *Attorney, Agent, or Firm* — Birch, Stewart, Kolasch & Birch, LLP

(57) ABSTRACT

Method and apparatus for individually positioning and mounting particles on a target carrier according to a predefined pattern. In particular the particles are spheres of an electrically chargeable material with a diameter in the range of 10 micrometer up to one millimeter and are electrically conductive.

16 Claims, 3 Drawing Sheets

(51) Int. Cl.
*B41J 2/415* (2006.01)
*B41M 1/12* (2006.01)

(56) References Cited

U.S. PATENT DOCUMENTS 6,070,967 A    6/2000   Bern
6,086,186 A    7/2000   Bergman et al.
6,158,346 A    12/2000  Zhang

OTHER PUBLICATIONS

Written Opinion of the International Searching Authority for PCT/EP2010/065708 dated Jan. 26, 2011.

APPARATUS AND METHOD FOR MOUNTING PARTICLES ON A CARRIER

CROSS-REFERENCE TO RELATED APPLICATIONS

This application is a continuation of U.S. patent application Ser. No. 13/443,382, filed Apr. 10, 2012, which is a continuation of PCT International Application No. PCT/EP2010/065708 filed on Oct. 19, 2010, which claims priority of Application No. 09173536.5 filed in Europe on Oct. 20, 2009 and Application No. 10177546.8 filed in Europe on Sep. 20, 2010. The contents of all of the above-identified applications are hereby expressly incorporated by reference into the present application.

BACKGROUND OF THE INVENTION

Field of the Invention

The invention relates to an apparatus and method for mounting particles on a carrier.

There is a need for a mounting tool for mounting particles on a carrier. In particular in situations where particles with a small diameter, e.g. typical 200 um, and with specific physical properties have to be positioned on a carrier in a well defined and controlled way.

SUMMARY OF THE INVENTION

The object of the invention is to realize a mounting tool and a method for individually positioning and mounting particles on a carrier.

To this end the mounting tool comprises:

a conductive storage bin for containing the particles, the particles having a particle diameter;

an intermediate carrier provided with a first pattern of conductive capture areas provided with an insulating layer, the areas having an area diameter, where the area diameter is less than or substantially equal to the particle diameter in order for each capture area to capture substantially one particle;

first transfer means for transferring the particles from the storage bin to the intermediate carrier according to the first pattern the first transfer means comprising means for electrical charging the capture areas; and second transfer means for transferring the particles from the intermediate carrier to the target carrier according to the first pattern.

It is desirable to be able to control accurately the position of particles to be mounted on a target carrier. This is realized by providing an intermediate carrier that has a number of well defined capture positions for capturing particles. Any layout of the pattern of capture areas on the intermediate carrier is possible, so that the position of each capture area, and hence the position of each particle to be mounted, may be defined individually.

By taking care that the diameter of the particles has the same order of magnitude as the diameter of the capture areas, that determine the positions within the pattern, it is possible to achieve that one individual particle is captured at one individual capture area.

Electrical charging takes care that particles will adhere to the capture areas on the intermediate carrier.

In a further embodiment the first transfer means comprises means for bringing the intermediate carrier into the direct vicinity of the particles in such a way that particles are attracted to the charged capture areas; and the second transfer means comprises means for positioning the intermediate carrier in the direct vicinity of the target carrier and means for positioning and fixing the particles on the target carrier.

In a further embodiment the capture areas of the first pattern are interconnected; the charging means comprises a power supply for applying a voltage between the conductive bin comprising the particles and the interconnected conductive capture areas of the first pattern; and the first transfer means further comprises rotating means for turning the conductive bin and the intermediate carrier together around an axis parallel to the intermediate carrier.

In this embodiment charging is well under control and controls the electrical force. By rotating the assembly of the conductive bin and the intermediate carrier, it is accomplished, in the upside down position, due to the gravitational force, that all capture areas will get any particles in their direct vicinity, whereupon capturing of one particle at each capture area is achieved due to the electrical force. Whereafter, as the turn will complete and the bin reaches its initial position, captured particles remain in their position at the intermediate carrier and redundant particles fall back in the conductive bin.

In a next embodiment the power supply comprises a polarity reversing circuit. In this embodiment polarity may be reversed once in a while, so that any residual charge built up on the external side of the intermediate carrier may be neutralized. Such a cumulative charge buildup will reduce the electrical field strength and therefore the electrostatic clamping force.

In order to prevent residual charge buildup, e.g. due to polarisation effects of the dielectric materials, cumulatively over a number of mounting cycles, the polarity of the applied voltage is reversed once for each mounting cycle. This neutralises any residual charge left from the previous mounting cycle. For the electrical attraction force the voltage polarity is not relevant regarding the square of the voltage in the formula for the electrical force. Moreover, all slow dielectric insulator material polarisation effects (due to slow alignment of polar molecules to an external electrical field, e.g. in polyimide) are neutralised in this manner.

BRIEF DESCRIPTION OF THE DRAWINGS

The invention will be explained in detail with reference to the accompanying drawings wherein FIG. 1 diagrammatically illustrates an intermediate carrier with a pattern of capture areas.

DETAILED DESCRIPTION OF THE INVENTION

Considered are particles with a diameter of circa 200 um and having a conductive surface, e.g. coated glass spheres.

Figure 1:
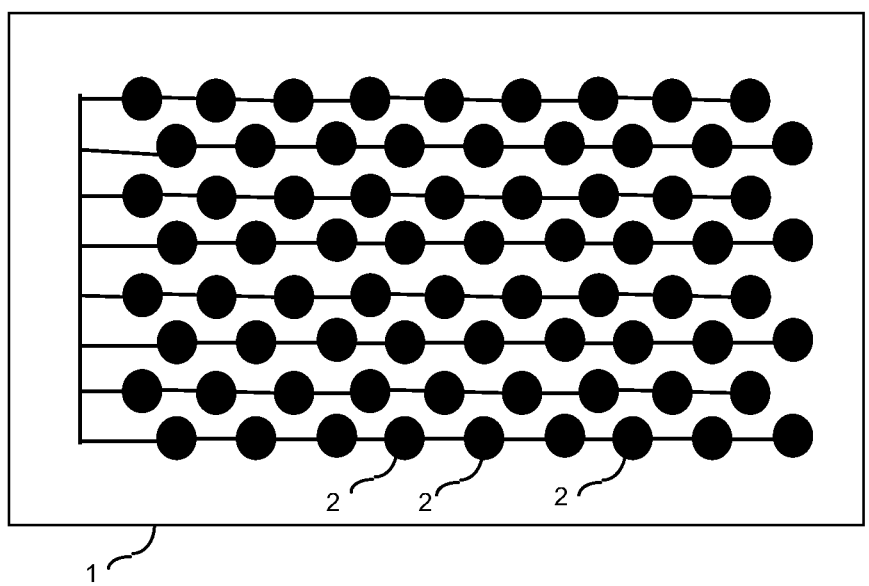

FIG. 1 diagrammatically illustrates an intermediate carrier 1, according to a first embodiment, provided with a pattern of interconnected conductive capture areas 2 on one side. The intermediate carrier may take the form of a printed circuit board or it may take the form of a photolithographic substrate. The distance between the centers of the conductive capture areas is 220 um (not illustrated on scale in the figure). These areas are circular shaped areas, whose center positions match the desired sphere positions on the target carrier.

In a particular embodiment (not shown in the figure) two electrically separate patterns of interconnected conductive capture areas are provided. The areas can be, e.g. in 2 groups of areas, set to any desirable voltage.

Figure 2:
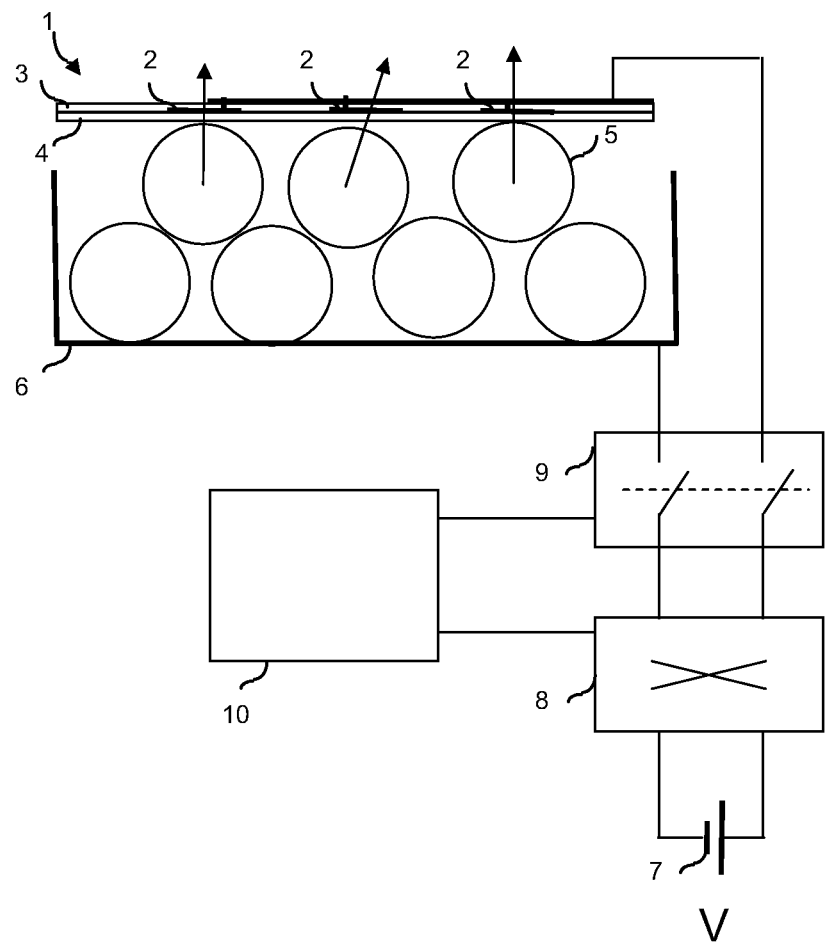
FIG. 2 diagrammatically illustrates a conductive bin containing particles and the intermediate carrier.

FIG. 2 illustrates a conductive bin containing particles and the intermediate carrier. The intermediate carrier 1 is shown in a cross sectional view showing an isolating substrate 3, interconnected conductive capture areas 2 on one side and an insulating layer 4, e.g. parylene, covering the conductive capture areas 2.

FIG. 2 further illustrates particles 5 collected in a flat collective bin 6, a DC voltage source 7, a polarity reversing unit 8, a switching unit 9 for applying and switching off the voltage and a control unit 10 for controlling both the polarity reversing unit 8 and the switching unit 9.

Figure 3:
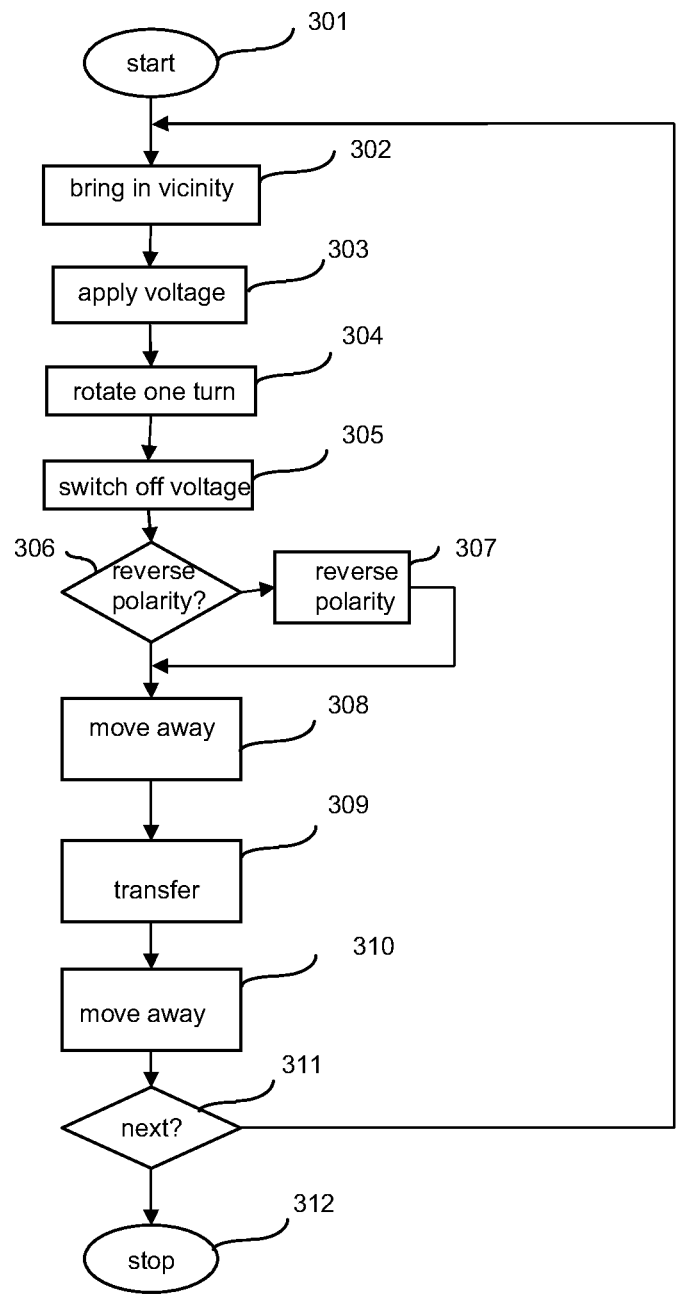
FIG. 3 shows a flow diagram illustrating a method according to the invention.

The method according to the invention will now be described with reference to FIG. 3.

In an initial situation the particles are collected in a flat conductive bin (step 301). In the next step (302) the intermediate carrier will be brought into the direct vicinity or even in contact with the upper layer of the particles in the bin, as indicated in FIG. 2. FIG. 2 shows the assembly of bin and intermediate carrier in an upright position, the gravitational force being directed downwards. In the next step (step 303) a voltage is applied between the conducting bin at one side and the pattern of interconnected conductive capture areas on the other side. Note that the insulating layer 3 at the intermediate carrier inhibits the flow of an electrical current. A voltage, maximum ca 1000V, from a voltage source 7, is applied between the bin and the spheres with a conductive surface on one side and the conductive circular capture areas on the other side. To further improve conductance from the bin towards the spheres in the bin, the inner sides of the bin may be covered with static eliminator brushes. Very large electrical forces will start working on the spheres in the vicinity of the intermediate carrier, that pull the spheres towards the centers of the conductive areas. The insulation is strong enough to prevent electrical discharge effects. As soon as a sphere covers a circular capture area on the intermediate carrier, the electrical field is locally shielded, so that no other spheres in the neighbourhood of the attracted sphere experience an attraction force to that same area.

The electrical force in the normal direction is given by the relationship:

$$F = \varepsilon_0 \varepsilon_r \frac{AV^2}{d^2}$$

where A is the relevant area of the dielectrical surfaces, V the voltage and d is the thickness of the insulating layer. Since one area is spherical this formula gives an estimation only.

In the next step the assembly of conductive bin, containing the particles, and intermediate is rotated gently one turn around the axis of the assembly (step 304) in order to bring the spheres in the direct vicinity of the capture areas. In the upside down position, half way the one turn, gravitational forces will bring the spheres in contact with the insulating layer and within the reach of the electrical field of the capture areas. In this respect it is important that the spheres make conductive contact with each other and with the conductive bin; if necessary static eliminator brushes may be used to ensure contact between the spheres and the bin. In the next half turn the assembly is turned gently in the upright position again. Only spheres within the field of an area will be captured and remain in this position.

Subsequently the voltage is switched off (step 305). Spheres positioned at the capture areas remain in that position due to an electrostatical inductive force. Since the capture areas have the same diameter as the spheres and the distance between capture areas is smaller than that diameter only one sphere will be attracted by one area. The remaining spheres will due to the gravitational force fall downwards in the bin. The gravitational force is determined by the weight of a particle. Providing a gentle vibration or gentle tap to the intermediate carrier will overcome any mechanical sticking forces.

In step 306 the control unit will determine if the voltage has to be reversed. If yes (Y) the polarity reversal circuit is actuated (step 307) whereafter the method continues with step 308. If not (N) the method continues directly with step 308. Polarity reversal may take place within each cycle, or it may take place after a number of cycles. In the first case step 306 can be omitted. Steps 306 and 307 may be executed anywhere in the procedure but between steps 303-305. In a preferred embodiment polarity reversal takes place with every cycle.

In step 308 the intermediate carrier provided with the spheres according to the pattern is now removed from the bin and is positioned opposite of the carrier.

In step 309 transfer of the particles from the intermediate carrier to the target carrier is carried out. In the proposed embodiment the target carrier is provided with an adhesive layer. The spheres are transferred to the carrier by slightly pushing the spheres against the adhesive layer. The adhesive forces are greater than the electrical forces, so that upon a small retraction the spheres remain on the right position on the carrier. If the target carrier is electrically conductive, a voltage may be applied to the target carrier that is equal to the intermediate carrier voltage. This will eliminate the electrical force as soon as a particle makes contact with the target carrier. This ensures a substantially entire transition of all spheres.

Next in step 310 the target carrier and the intermediate carrier are moved away from each other, the intermediate carrier is brought in its initial position and the target carrier, provided with the desired pattern of particles, is ready for another process step.

In step 311 it is checked if a next cycle has to be started. If so (Y) the method returns to step 302, if not the method ends (step 312).

In a second embodiment of the intermediate carrier, the intermediate carrier takes the form of a monolayer of metal balls (or other spheres at least conductive at the surface) soldered on a metal sheet and covered by an insulating layer. The particles to be transferred will be positioned in the cavities between the balls. Each cavity thus forms a capture area.

Particles will be pulled into the cavities due to the electrical force. Tangential forces due to the balls that surround the cavity take care that the particles are accurately positioned.

It is a matter of design choice of the appropriate positions of the balls, appropriate diameter of the balls and appropriate distances between the balls to obtain a desired first pattern with well defined distances between the particles. In this way an optimal packing of the particles, however with well defined distances between the particles, can be realized.

Also an embodiment is envisaged where the intermediate carrier is embodied as a surface on a rotating cylinder with at least two zones extending in an axial direction, a first zone for transferring the particles from the storage bin to the intermediate carrier and a second zone for transferring the particles from the intermediate carrier to the target carrier. The cylinder may have a circular cross section and a zone may be one particle wide. However also embodiments are envisaged where the cylinder has a polynomal cross section and one zone corresponds with one flat surface of the cylinder surface.

In case two distinct patterns of conductive areas are provided on the intermediate carrier two distinct types of particles can be mounted on the target carrier by control of the voltage supplied to each pattern, the dimensions of the area of each pattern and the sequence of process steps.

By applying the mounting tool and the method each particle will be accurately positioned at the target carrier and thus also the distances between the particles on the carrier will be well under control.

The invention claimed is:

1. A mounting tool for individual positioning and mounting particles on a target carrier, the mounting tool comprising:
   a conductive storage bin for containing the particles, the particles having a particle diameter;
   an intermediate carrier provided with a first pattern of conductive capture areas provided with an insulating layer, the areas having an area diameter, where the area diameter is less than or substantially equal to the particle diameter in order for each capture area to capture substantially one particle;
   a first transfer device configured to transfer the particles from the storage bin to the intermediate carrier according to the first pattern, the first transfer device comprising an electrical charging device configured to electrically charge the capture areas;
   a device configured to bring the intermediate carrier into the direct vicinity of the particles in such a way that particles are attracted to the charged capture areas; and
   a second transfer device configured to transfer the particles from the intermediate carrier to the target carrier according to the first pattern, the second transfer device comprising a device configured to position the intermediate carrier in the direct vicinity of the target carrier and a device configured to position and fix the particles on the target carrier.

2. The mounting tool according to claim 1, further comprising a fixing device configured to push the particle against an adhesive layer of the target carrier.

3. The mounting tool according to claim 2, wherein:
   the capture areas of the first pattern are conductively interconnected;
   the charging device comprises a power supply for applying a voltage between the conductive bin comprising the particles and the interconnected conductive capture areas of the first pattern; and
   the first transfer device further comprises a rotating device configured to turn the conductive bin and the intermediate carrier together around an axis parallel to the intermediate carrier.

4. The mounting tool according to claim 3, wherein the voltage has a polarity, and the power supply comprises a polarity reversing device configured to reverse the polarity of the applied voltage each time after an interval.

5. The mounting tool according to claim 1, wherein the intermediate carrier comprises a flat substrate provided with a conductive pattern of dots and traces between the dots and covered with an insulating layer, the dots corresponding with the first pattern and forming the capture areas.

6. The mounting tool according to claim 1, wherein the intermediate carrier comprises a metal sheet provided with metal balls, where cavities between at least three metal balls form the capture areas.

7. A method for individually positioning and mounting particles on a target carrier, the method comprising:
   a first transferring step of transferring the particles from a storage bin to an intermediate carrier and a second transferring step of transferring the particles from the intermediate carrier to the target carrier,
   the first transferring step further comprising the steps of:
   applying a voltage to a pattern of interconnected conductive capture areas on a first side of the intermediate carrier, the pattern being covered with an insulating layer;
   bringing the first side of the intermediate carrier in the direct vicinity of particles stored in the conductive storage bin;
   disconnecting the voltage from the interconnected conductive capture areas; and
   moving the intermediate carrier with a monolayer of particles according to the pattern from the bin; and
   the second transferring step further comprising the steps of:
   positioning the intermediate carrier with the monolayer of particles according to the pattern in front of the target carrier, the target carrier being provided with an adhesive layer;
   pushing the monolayer of particles against the adhesive layer of the target carrier; and
   curing the adhesive layer for fixing the monolayer of particles onto the target carrier.

8. The method according to claim 7, the voltage to be applied having a polarity, wherein the first transferring step further comprises the step of reversing the polarity of the voltage before the step of applying the voltage.

9. The mounting tool according to claim 2, wherein the intermediate carrier comprises a flat substrate provided with a conductive pattern of dots and traces between the dots and covered with an insulating layer, the dots corresponding with the first pattern and forming the capture areas.

10. The mounting tool according to claim 3, wherein the intermediate carrier comprises a flat substrate provided with a conductive pattern of dots and traces between the dots and covered with an insulating layer, the dots corresponding with the first pattern and forming the capture areas.

11. The mounting tool according to claim 4, wherein the intermediate carrier comprises a flat substrate provided with a conductive pattern of dots and traces between the dots and covered with an insulating layer, the dots corresponding with the first pattern and forming the capture areas.

12. The mounting tool according to claim 2, wherein the intermediate carrier comprises a metal sheet provided with metal balls, where cavities between at least three metal balls form the capture areas.

13. The mounting tool according to claim 3, wherein the intermediate carrier comprises a metal sheet provided with metal balls, where cavities between at least three metal balls form the capture areas.

14. The mounting tool according to claim 4, wherein the intermediate carrier comprises a metal sheet provided with metal balls, where cavities between at least three metal balls form the capture areas.

15. The mounting tool according to claim 1, wherein the capture areas of the first pattern are conductively interconnected.

16. The mounting tool according to claim 1, further comprising an adhesive layer on the target carrier.

* * * * *